United States Patent
Hong et al.

(10) Patent No.: US 11,881,382 B2
(45) Date of Patent: Jan. 23, 2024

(54) APPARATUS AND METHOD FOR TREATING SUBSTRATE

(71) Applicant: SEMES CO., LTD., Chungcheongnam-do (KR)

(72) Inventors: Jun Pyo Hong, Gyeonggi-do (KR); Seungbae Lee, Gyeonggi-do (KR); Ki Yung Lee, Gyeonggi-do (KR)

(73) Assignee: Semes Co., Ltd., Chungcheongnam-do (KR)

( * ) Notice: Subject to any disclaimer, the term of this patent is extended or adjusted under 35 U.S.C. 154(b) by 282 days.

(21) Appl. No.: 16/918,219

(22) Filed: Jul. 1, 2020

(65) Prior Publication Data
US 2021/0013008 A1    Jan. 14, 2021

(30) Foreign Application Priority Data
Jul. 9, 2019    (KR) .................... 10-2019-0082604

(51) Int. Cl.
*H01J 37/32*    (2006.01)
*H01J 37/34*    (2006.01)
*H01L 21/683*    (2006.01)
*H01L 21/02*    (2006.01)

(52) U.S. Cl.
CPC .... *H01J 37/32174* (2013.01); *H01J 37/3444* (2013.01); *H01L 21/02315* (2013.01); *H01L 21/6831* (2013.01)

(58) Field of Classification Search
None
See application file for complete search history.

(56) References Cited

U.S. PATENT DOCUMENTS

| | | | | |
|---|---|---|---|---|
| 5,459,632 A | * | 10/1995 | Birang | H02N 13/00 307/130 |
| 5,612,850 A | * | 3/1997 | Birang | H01L 21/6831 361/234 |
| 6,057,244 A | * | 5/2000 | Hausmann | H01J 37/32137 438/711 |
| 7,541,283 B2 | * | 6/2009 | Shindo | H01J 37/32082 438/680 |
| 10,304,664 B2 | | 5/2019 | Moon et al. | |

(Continued)

FOREIGN PATENT DOCUMENTS

| | | |
|---|---|---|
| CN | 105470125 A | 4/2016 |
| CN | 105990194 A | 10/2016 |

(Continued)

OTHER PUBLICATIONS

Korean Notification of Reason for Refusal issued in Korean Application No. 10-2020-0187694, dated Apr. 6, 2021, with translation, 10 pages.

*Primary Examiner* — Ram N Kackar
(74) *Attorney, Agent, or Firm* — RatnerPrestia (57) ABSTRACT

Provided is an apparatus for treating a substrate. The substrate treating apparatus includes a substrate supporting unit for supporting the substrate and fixing the substrate with electrostatic force, a plasma generating unit for generating a discharging plasma for discharging a charge of the substrate, and a power supplying unit for supplying power to the substrate supporting unit and the plasma generating unit, wherein the power supplying unit supplies power of a fluctuating pattern to the plasma generating unit when a charge of the substrate is discharged.

15 Claims, 4 Drawing Sheets

(56) References Cited

U.S. PATENT DOCUMENTS

| | | | |
|---|---|---|---|
| 2003/0236004 A1* | 12/2003 | Sung | H01L 21/6833 438/795 |
| 2006/0087793 A1 | 4/2006 | Kim et al. | |
| 2006/0238953 A1* | 10/2006 | Hanawa | H01L 21/6831 361/234 |
| 2016/0093473 A1 | 3/2016 | Moon et al. | |
| 2017/0316981 A1* | 11/2017 | Chen | H01L 21/0217 |

FOREIGN PATENT DOCUMENTS

| | | |
|---|---|---|
| JP | 2005051098 A | 2/2005 |
| JP | 2007208302 A | 8/2007 |
| KR | 100267784 B1 | 7/2000 |
| KR | 100329165 A | 3/2002 |
| KR | 100637602 B1 | 10/2006 |
| KR | 100653707 B1 | 12/2006 |
| KR | 20080001336 A | 1/2008 |
| KR | 1020110016486 A | 2/2011 |
| KR | 101124789 B1 | 3/2012 |
| KR | 20180014943 A | 2/2018 |

* cited by examiner

APPARATUS AND METHOD FOR TREATING SUBSTRATE

CROSS-REFERENCE TO RELATED APPLICATIONS

This patent application claims the benefit of Korean Patent Application No. 10-2019-0082604, filed on Jul. 9, 2019, which is hereby incorporated by reference in its entirety into this application.

BACKGROUND

Field

The present invention relates to an apparatus and method for treating a substrate.

Description of the Related Art

When manufacturing a semiconductor device or a display device, various processes such as photography, etching, ashing, ion implantation, thin film deposition and cleaning are performed. Here, the photography process includes coating, exposure and development processes. A photoresist is applied onto the substrate (i.e., the coating process), a circuit pattern is exposed on the substrate, on which the photosensitive film is formed (i.e., exposure process), and the exposed areas of the substrate are selectively developed (i.e., development process).

The substrate in the process chamber can be supported by an electrostatic chuck. The electrostatic chuck can fix the substrate with electrostatic force generated by electrostatic induction.

SUMMARY

The problem to be solved by the present invention is to provide an apparatus and method for treating a substrate.

The problems of the present invention are not limited to the problems mentioned above, and other problems not mentioned will be clearly understood by those skilled in the art from the following description.

One aspect of the substrate treating apparatus of the present invention for achieving the above object comprises a substrate supporting unit for supporting the substrate and fixing the substrate by electrostatic force, a plasma generating unit for generating a discharging plasma for discharging a charge of the substrate, and a power supplying unit for supplying power to the substrate supporting unit and the plasma generating unit, wherein the power supplying unit supplies power of a fluctuating pattern to the plasma generating unit when a charge of the substrate is discharged.

The power supplying unit includes a first power supplying unit supplying DC power to the substrate supporting unit and a second power supplying unit supplying RF power to the plasma generating unit.

The first power supplying unit applies a first discharging DC voltage that is smaller compared to a DC voltage for process treating of the substrate when a charge of the substrate is discharged, and applies a second discharging DC voltage that is smaller than the first discharging DC voltage after the first discharging DC voltage is applied.

The second power supplying unit supplies a first discharging RF power that is smaller compared to RF power for process treating of the substrate when a charge of the substrate is discharged, and supplies a second discharging RF power that is grater than the first discharge RF power after the first discharging RF power is supplied, and supplies a third discharging RF power that is smaller than the first discharging RF power and the second discharging RF power after the second discharging RF power is supplied.

A power pattern supplied by the first power supplying unit and the second power supplying unit comprises a process treating section, in which process treating for the substrate is performed, a discharge starting section, in which discharge is started when the process for the substrate is completed, a disorder degree improving section for improving the disorder degree of a charge remaining on the substrate, and a discharge finishing section for continuously discharging a charge remaining on the substrate.

The first power supplying unit supplies power that is smaller compared to the process treating section in the discharge starting section, and supplies power that is smaller compared to the discharge starting section in the disorder degree improving section and the discharge finishing section.

The second power supplying unit supplies power that is smaller compared to the process treating section in the discharge starting section, supplies power that is smaller to the process treating section and greater compared to the discharge starting section in the disorder degree improving section, and supplies power that is smaller compared to the discharge starting section and the disorder degree improving section in the discharge finishing section.

The discharging plasma includes the same plasma as the processing plasma formed by excitation of a process gas used in the process of the substrate.

The discharging plasma is generated after the process for the substrate is completed by the processing plasma.

The power supplying unit increases the disorder degree of a charge existing on the substrate by changing the intensity of a charge acting on the substrate by the discharging plasma.

One aspect of the substrate treating method of the present invention for achieving the above object comprises performing a process for a substrate fixed to a substrate supporting unit by electrostatic force, and removing a charge remaining on the substrate by generating a discharging plasma using a plasma generating unit, wherein the discharging plasma includes a plasma generated by supplying power of a fluctuating pattern to the plasma generating unit.

The first power supplying unit for applying a DC voltage to the substrate supporting unit applies a first discharging DC voltage that is smaller compare to a DC voltage for process treating of the substrate when a charge of the substrate is discharged, and applies a second discharging DC voltage that is smaller than the first discharging DC voltage after the first discharging DC voltage is applied.

The second power supplying unit for supplying RF power to the plasma generating unit supplies a first discharging RF power that is smaller compared to RF power for process treating of the substrate when a charge of the substrate is discharged, and supplies second discharging RF power that is greater than the first discharging RF power after the first discharging RF power is supplied, and supplies a third discharging RF power that is smaller than the first discharging RF power and the second discharging RF power after the second discharging RF power is supplied.

The power pattern, in which power is supplied to the substrate supporting unit and the plasma generating unit, comprises a process treating section, in which process treating for the substrate is performed, a discharge starting section, in which discharge is started when the process for the substrate is completed, a disorder degree improving section for improving the disorder degree of a charge remaining on the substrate, and a discharge finishing section for continuously discharging a charge remaining on the substrate.

Power that is smaller compared to the process treating section is supplied to the substrate supporting unit in the discharge starting section, and power that is smaller compared to the discharge starting section is supplied to the substrate supporting section in the disorder degree improving section and the discharge finishing section.

Power that is smaller compared to the process treating section is supplied to the plasma generating unit in the discharge starting section, power that is smaller compared to the process treating section and greater compared to the discharge starting section is supplied to the plasma generating unit in the disorder degree improving section, and power that is smaller compared to the discharge starting section and the disorder degree improving section is supplied to the plasma generating unit in the discharge finishing section.

The discharging plasma includes the same plasma as the processing plasma formed by excitation of a process gas used in the process of the substrate.

The discharging plasma generated by the fluctuating power pattern increases the disorder degree of a charge existing on the substrate by changing the intensity of a charge acting on the substrate.

Another aspect of the substrate treating apparatus of the present invention for achieving the above object comprises a substrate supporting unit for supporting a substrate and fixing the substrate by electrostatic force, and a plasma generating unit for generating a discharging plasma for discharging a charge of the substrate and a power supplying unit for supplying power to the substrate supporting unit and the plasma generating unit, wherein the power supplying unit supplies a first discharging RF power that is smaller compared to when the process for the substrate is treated to the plasma generating unit when a charge of the substrate is discharged, and then supplies a second discharging RF power that is greater than the first discharging RF power to the plasma generating unit, and then supplies a third discharging RF power that is smaller compared to the second discharging RF power to the plasma generating unit, and the third discharging RF power has a value greater than zero.

The second discharging RF power improves the disorder degree of a charge remaining on the substrate.

Details of other embodiments are included in the detailed description and drawings.

DETAILED DESCRIPTION

Hereinafter, preferred embodiments of the present invention will be described in detail with reference to the accompanying drawings. Advantages and features of the present invention, and methods for achieving them will be clarified with reference to embodiments described below in detail together with the accompanying drawings. However, the present invention is not limited to the embodiments disclosed below, but may be implemented in various different forms, and only the embodiments allow the publication of the present invention to be complete, and are provided to fully inform those skilled in the technical field to which the present invention pertains of the scope of the invention, and the invention is only defined by the scope of the claims. The same reference numerals refer to the same components throughout the specification.

When elements or layers are referred to as "on" or "above" of other elements or layers, it includes not only when directly above of the other elements or layers, but also other layer or other element intervened in the middle. On the other hand, when elements are referred to as "directly on" or "directly above," it indicates that no other element or layer is intervened therebetween.

The spatially relative terms "below," "beneath," "lower," "above," "upper," etc., as shown in figures, can be used to easily describe the correlation of an element or components with other elements or components. The spatially relative terms should be understood as terms including different direction of the element in use or operation in addition to the direction shown in the drawing. For example, if the element shown in the figure is turned over, an element described as "below" or "beneath" the other element may be placed "above" the other element. Accordingly, the exemplary term "below" can include both the directions of below and above. The element can also be oriented in other directions, so that spatially relative terms can be interpreted according to the orientation.

Although the first, second, etc. are used to describe various elements, components and/or sections, these elements, components and/or sections are not limited by these terms. These terms are only used to distinguish one element, component or section from another element, component or section. Therefore, the first element, first component or first section mentioned below may be a second element, second component or second section within the technical spirit of the present invention.

The terminology used herein is for describing the embodiments and is not intended to limit the present invention. In the present specification, the singular form also includes the plural form unless otherwise specified in the phrase. As used herein, "comprises" and/or "comprising" means that the components, steps, operations and/or elements mentioned above do not exclude the presence or additions of one or more other components, steps, operations and/or elements.

Unless otherwise defined, all terms (including technical and scientific terms) used in the present specification may be used as meanings commonly understood by those skilled in the art, to which the present invention pertains. Further, terms defined in the commonly used dictionary are not ideally or excessively interpreted unless specifically defined.

Hereinafter, exemplary embodiments of the present invention will be described in detail with reference to the accompanying drawings, and in the description with reference to the accompanying drawings, the same or corresponding components are assigned the same reference numbers regardless of reference numerals, and the description overlapped therewith will be omitted.

Figure 1:
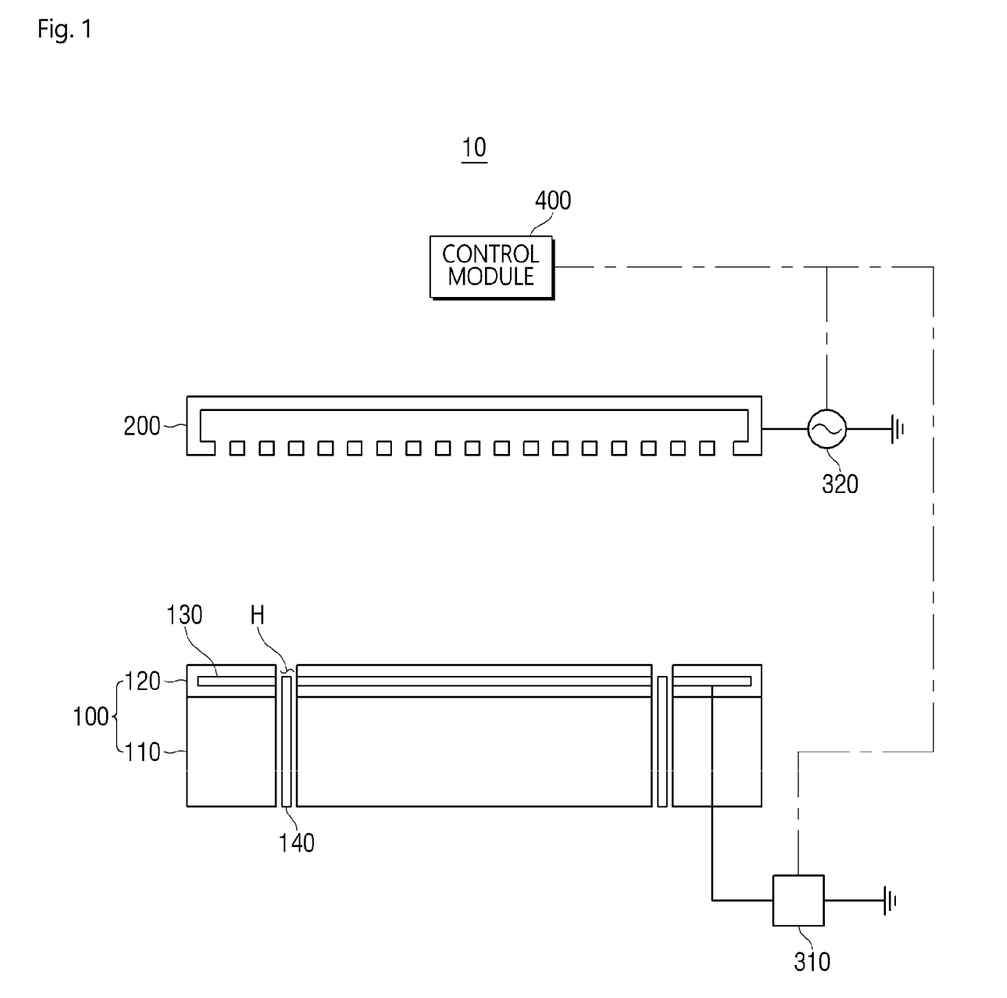
FIG. 1 is a diagram showing a substrate treating apparatus according to an embodiment of the present invention.

FIG. 1 is a diagram showing a substrate treating apparatus according to an embodiment of the present invention.

Referring to FIG. 1, the substrate treating apparatus 10 includes a substrate supporting unit 100, a plasma generating unit 200, power supplying units 310, 320, and a control unit 400.

The substrate supporting unit 100 may support the substrate. Further, the substrate supporting unit 100 may fix the supported substrate with the electrostatic force. The substrate supporting unit 100 includes an electrostatic body 110 and an electrostatic chuck 120.

The electrostatic body 110 may support the electrostatic chuck 120. Further, the electrostatic body 110 may space the electrostatic chuck 120 by a predetermined distance with respect to the bottom surface of the space provided with the substrate supporting unit 100.

The electrostatic chuck 120 serves to support the substrate. One surface of the substrate is opposed to the electrostatic chuck 120, and the one surface of the substrate may be supported in close contact with the support surface of the electrostatic chuck 120.

The electrostatic chuck 120 may fix the substrate with electrostatic force. To this end, the electrostatic chuck 120 may include an electrostatic electrode 130. The electrostatic electrode 130 may be electrically connected to the first power supplying unit 310. The electrostatic electrode 130 may generate electrostatic force by power supplied from the first power supplying unit 310. The power supplied by the first power supplying unit 310 may be DC power. The substrate may be adsorbed to the electrostatic chuck 120 by the electrostatic force of the electrostatic electrode 130.

A through hole H may be formed in the substrate supporting unit 100. The through hole H may be formed to sequentially cross the electrostatic body 110 and the electrostatic chuck 120. The lift pin 140 may move along the through hole H. That is, the lift pin 140 may move in the longitudinal direction of the through hole H.

The lift pin 140 serves to elevate the substrate seated on the substrate supporting unit 100. An opening is formed in the support surface of the electrostatic chuck 120 by the through hole H of the substrate supporting unit 100, and the lift pin 140 is protruded or inserted through the opening to raise and lower the substrate. Although not illustrated, a driving unit (not shown) for elevating the lift pin 140 along the through hole H may be provided.

The plasma generating unit 200 may be disposed on the substrate supporting unit 100. A treating space for a process for a substrate may be formed between the plasma generating unit 200 and the substrate supporting unit 100.

The plasma generating unit 200 may generate plasma for a process for a substrate. The plasma generating unit 200 may inject process gas into the treating space and excite the process gas into plasma by applying RF power.

Further, the plasma generating unit 200 may generate a discharging plasma for discharging a charge of the substrate. The discharging plasma may be a plasma, in which process gas is excited, or a plasma, in which a separate gas is excited.

The power supplying units 310, 320 serve to supply power to the substrate supporting unit 100 and the plasma generating unit 200. With the power supplied from the power supplying units 310 and 320, the substrate supporting unit 100 generates an electrostatic force, and the plasma generating unit 200 may generate plasma.

When the substrate supporting unit 100 fixes the substrate with electrostatic force for a process for the substrate, residual charge may exist on the substrate even after the process is completed. The residual charge may generate an electrostatic force and prevent the substrate from being separated from the substrate supporting unit 100. For example, when a substrate is lifted with a lift pin while residual charge exists on the substrate, the substrate may be damaged or slipped. Therefore, it is preferable to lift the substrate after discharging the charge of the substrate to remove all residual charges exiting on the substrate.

The power supplying unit 320 may supply power of a fluctuating pattern to the plasma generating unit 200 when a charge of the substrate is discharged. That is, the power supplying unit 320 is capable of supplying the power of the rising and falling pattern to the plasma generating unit 200. As the size of the power is changed, the intensity of the charge acting on the substrate is changed by the discharging plasma, and the disorder degree of the charge existing on the substrate is increased and the electrostatic force is reduced.

The power supplying units 310, 320 include a first power supplying unit 310 and a second power supplying unit 320. The first power supplying unit 310 may supply DC power to the substrate supporting unit 100, and the second power supplying unit 320 may supply RF power to the plasma generating unit 200.

The control unit 400 may control the first power supplying unit 310 and the second power supplying unit 320. The first power supplying unit 310 and the second power supplying unit 320 may adjust the size of power supplied by the control of the control unit 400.

Hereinafter, a process and a discharging process for the substrate will be described with reference to FIGS. 2 to 4.

Figure 2:
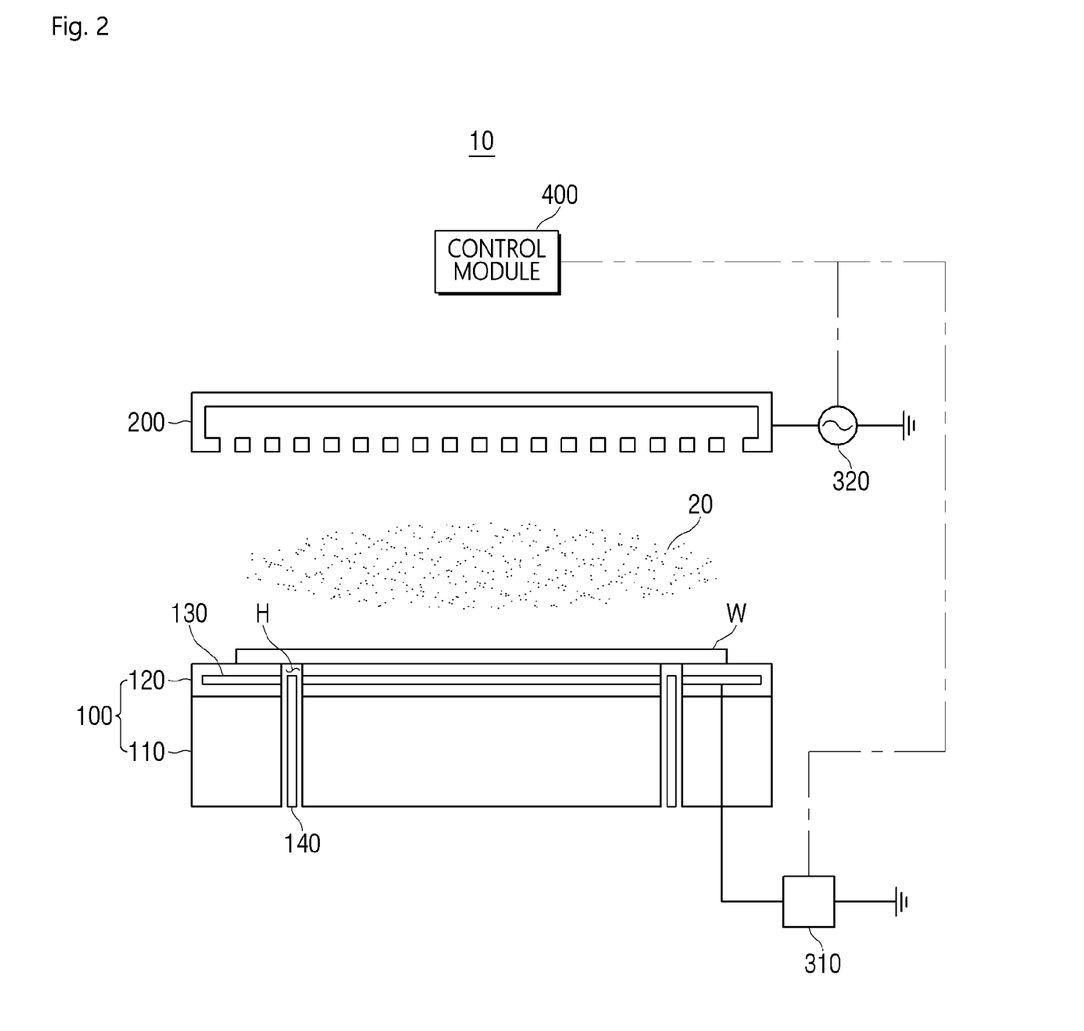
FIG. 2 is a diagram showing a process for a substrate supported by the substrate treating apparatus shown in FIG. 1 is performed.
Figure 3:
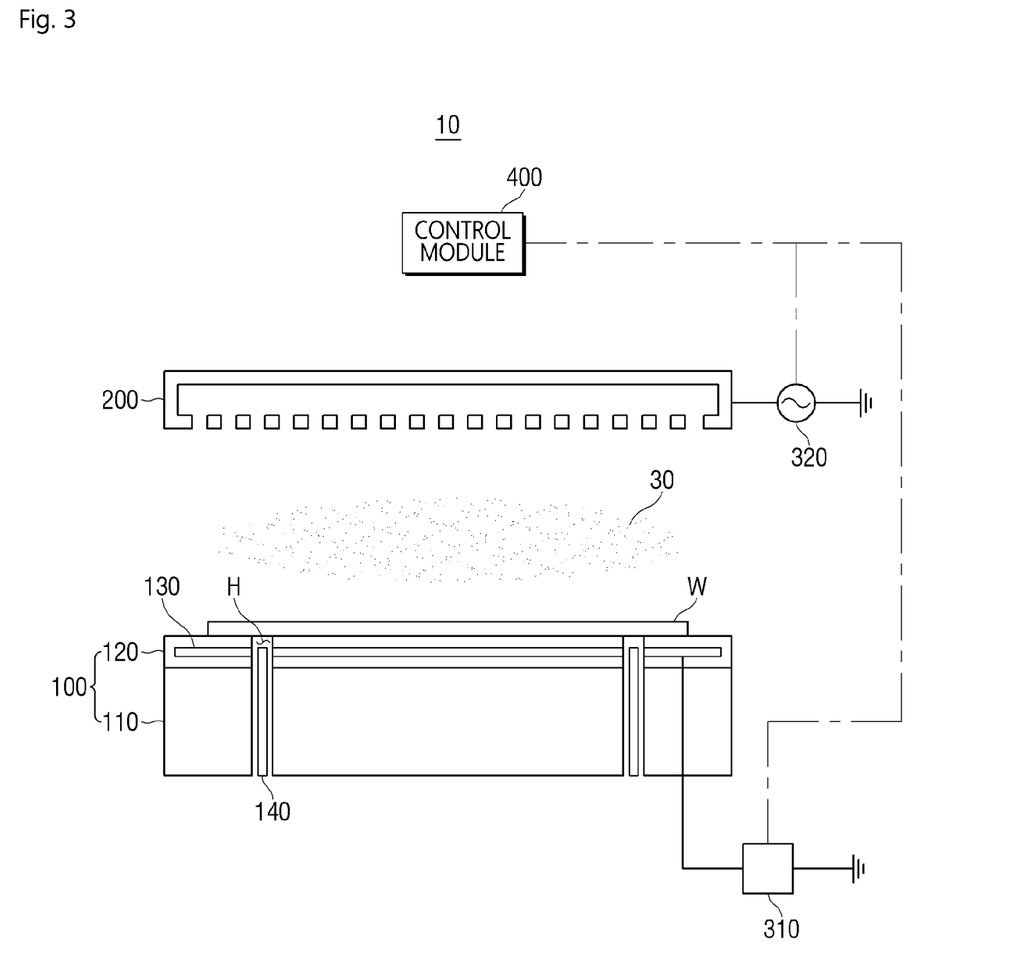
FIG. 3 is a diagram showing that plasma for discharge is generated in the substrate, for which the process is completed in FIG. 2.
Figure 4:
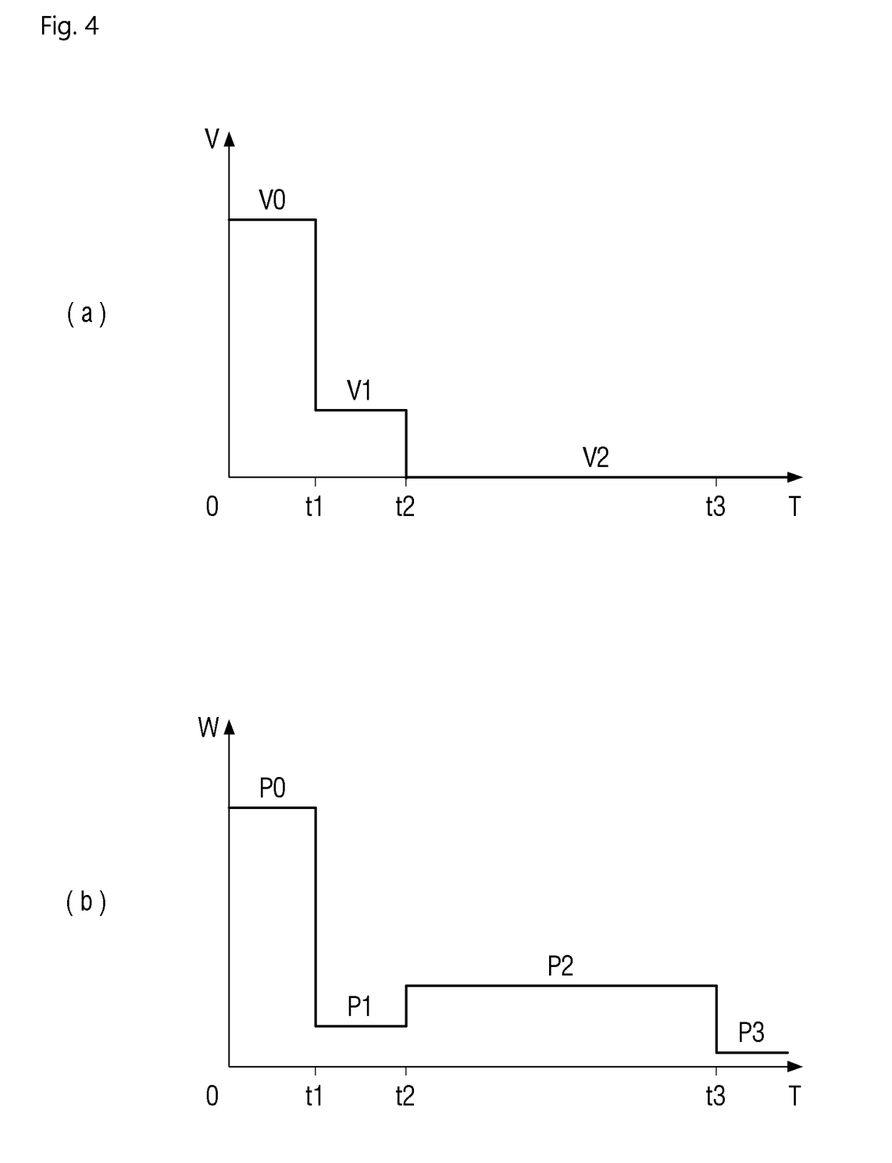
FIG. 4 is a diagram showing a power pattern, which is supplied by the power supplying unit during the process for the substrate shown in FIGS. 2 and 3.

FIG. 2 is a diagram showing that a process for a substrate supported by the substrate treating apparatus shown in FIG. 1 is performed, FIG. 3 is a diagram showing that plasma for discharge is generated in the substrate, for which the process is completed in FIG. 2, and FIG. 4 is a diagram showing a power pattern supplied by the power supplying unit during the process for the substrate shown in FIGS. 2 and 3;

Referring to FIG. 2, a process for the substrate W supported by the substrate supporting unit 100 may be performed. For example, processes such as etching, thin film deposition or cleaning for the substrate W may be performed. At this time, a process by the plasma 20 may be performed.

To process for the substrate W, the electrostatic chuck 120 may fix the substrate W with electrostatic force. At this time, one surface of the substrate W in contact with the electrostatic chuck 120 may be charged with an opposite charge to the electrostatic electrode 130.

Referring to FIG. 3, a plasma 30 for discharge may be generated for the substrate W, for which the process is completed.

Some of the charges charged on the substrate W may be discharged by the discharging plasma 30. The discharging plasma 30 may be the same as the processing plasma 20.

In discharging the charge remaining on the substrate W, the control unit 400 may control the first power supplying unit 310 and the second power supplying unit 320. Under the control of the control unit 400, the first power supplying unit 310 may apply a first discharging DC voltage that is smaller compared to the DC voltage for process treating of the substrate W when the charge of the substrate W is discharged, and may apply a second discharging DC voltage that is smaller than the first discharging DC voltage after the first discharging DC voltage is applied. Further, under the control of the control unit 400, the second power supplying unit 320 may supply the first discharging RF power that is smaller compared to the RF power for process treating of the substrate W when the charge of the substrate W is discharged, and supply the second discharging RF power that is greater than the first discharging RF power after the first discharging RF power is supplied, and supply the third discharging FR power that is smaller than first discharging RF power and the second discharging RF power after the second discharging RF power id supplied.

FIG. 4 illustrates an exemplary power pattern supplied by the first power supplying unit 310 and the second power supplying unit 320 during the process and discharge for the substrate W.

FIG. 4(a) shows the voltage of the power supplied by the first power supplying unit 310, and FIG. 4(b) shows the size of the power supplied by the second power supplying unit 320.

The section from 0 to t1 indicates a section, in which process treating for the substrate W is performed. At this time, the first power supplying unit 310 and the second power supply uniting 320 may supply relatively large power for the process.

t1 is a time point, at which the process for the substrate W is completed, and the section from t1 to t2 indicates a section, at which discharge to the substrate W is started. At this time, the first power supplying unit 310 applies a first discharging DC voltage V1 that is smaller compared to the DC voltage V0 for process treating, and the second power supplying unit 320 may supply a first discharging RF power P1 that is smaller compared to RF power P0 for process treating.

The section from t2 to t3 indicates a section to improve the disorder degree of the charge remaining on the substrate W. At this time, the first power supplying unit 310 may apply a second discharging DC voltage V2 that is smaller than the first discharging DC voltage V1, and the second power supplying unit 320 may supply the second discharging RF power P2 that is greater than the first discharging RF power P1. Here, the second discharging DC voltage V2 may be 0V.

After the relatively small first discharging RF power P1 is supplied, as the relatively large second discharging RF power P2 is supplied, the disorder degree of the charge remaining on the substrate W increases.

The subsequent section of t3 indicates a section, where discharge to the substrate W is finished. At this time, the second power supplying unit 320 may supply the third discharging RF power P3 that is smaller than the first discharging RF power P1 and the second discharging RF power P2. As the third discharging RF power P3 of a very small size is supplied, the charge remaining on the substrate W continues to discharge through the discharging plasma 30.

Although the embodiments of the present invention have been described with reference to the above and the accompanying drawings, those of ordinary skill in the art to which the present invention pertains could understand that the present invention may be implemented in other specific forms without changing its technical spirit or essential features. Therefore, it should be understood that the embodiments described above are illustrative in all respects and not restrictive.

REFERENCE NUMERALS

10: substrate treating apparatus
100: substrate supporting unit
110: electrostatic body
120: electrostatic chuck
130: electrostatic electrode
140: lift pin
200: plasma generating unit
310, 320: power supplying unit
400: control unit

What is claimed is:

1. An apparatus for treating a substrate comprising:
a substrate supporting unit for supporting a substrate on an electrostatic chuck;
a plasma generating unit for generating a discharging plasma for discharging a charge of the substrate during de-chucking;
a DC voltage supplying unit for supplying a DC voltage to the substrate supporting units the DC voltage being a DC voltage for chucking the substrate during treating the substrate; and
an RF power supplying unit for supplying an RF power to the plasma generating unit the RF power being a process RF power for treating the substrate,
wherein the RF power supplying unit,
supplies a second discharging RF power smaller than the process RF power to the plasma generating unit during a second discharging time period,
supplies a third discharging RF power greater than zero and smaller than the second discharging RF power to the plasma generating unit during a third discharging time period after the second discharging time period, and
supplies a first discharging RF power smaller than the process RF power, smaller than the second discharging RF power, and greater than the third discharging RF power to the plasma generating unit during a first discharging time period prior to the second discharging time period,
wherein the DC voltage supplying unit supplies a first discharging DC voltage smaller than the DC voltage to the substrate supporting unit during the first discharging time period and supplies a second discharging DC voltage smaller than the first discharging DC voltage to the substrate supporting unit during the second and third discharging time periods.

2. The substrate treating apparatus of claim 1, wherein the second discharging time period is longer than the first discharging time period.

3. The substrate treating apparatus of claim 1, wherein the second discharging DC voltage is 0V.

4. The substrate treating apparatus of claim 1, wherein a process performed by the substrate treating apparatus is one of an etching process, a thin film deposition process, and a cleaning process.

5. The substrate treating apparatus of claim 1, wherein the plasma generating unit injects a process gas and excites the process gas into a process plasma with the RF power.

6. The substrate treating apparatus of claim 1, wherein the plasma generating unit generates the discharging plasma after a process for the substrate is completed and before the substrate, in which the process is completed, is separated from the substrate supporting unit,
wherein the DC voltage supplying unit supplies the DC voltage to the substrate supporting unit during the process,
wherein the RF power supplying unit supplies the process RF power to the plasma generating unit during the process.

7. A substrate treating method for a substrate treating apparatus including a substrate supporting unit comprising an electrostatic chuck and a plasma generating unit comprising:

supplying a DC voltage to the substrate supporting unit and supplying an RF power to the plasma generating unit, the DC voltage being a DC voltage for chucking the substrate and the RF power being a process RF power for treating the substrate;

supplying a second discharging DC voltage smaller than the DC voltage to the substrate supporting unit and supplying a second discharging RF power smaller than the process RF power to the plasma generating unit during a second discharging time period;

supplying the second discharging DC voltage to the substrate supporting unit and supplying a third discharging RF power greater than zero and smaller than the second discharging RF power to the plasma generating unit during a third discharging time period after the second discharging time period; and supplying a first discharging DC voltage smaller than the DC voltage to the substrate supporting unit and supplying a first discharging RF power smaller than the process RF power, smaller than the second discharging RF power, and greater than the third discharging RF power to the plasma generating unit during a first discharging time period prior to the second discharging time period.

8. The substrate treating method of claim 7 further comprising,
separating the substrate from the substrate supporting unit after the third discharging time period.

9. The substrate treating method of claim 7,
wherein the first discharging DC voltage is greater than the second discharging DC voltage.

10. The substrate treating method of claim 7,
wherein the second discharging time period is longer than the first discharging time period.

11. The substrate treating method of claim 7,
wherein the second discharging DC voltage is 0V.

12. The substrate treating method of claim 7,
wherein a process performed by the substrate treating apparatus is one of an etching process, a thin film deposition process, and a cleaning process.

13. The substrate treating method of claim 7,
wherein the plasma generating unit injects a process gas during a process period and excites the process gas into a process plasma with the RF power.

14. The substrate treating method of claim 7,
wherein a DC voltage supplying unit supplies the DC voltage to the substrate supporting unit during a process period for the substrate,
wherein an RF power supplying unit supplies the process RF power to the plasma generating unit during the process period.

15. A substrate treating method for a substrate treating apparatus including a substrate supporting unit comprising an electrostatic chuck and a plasma generating unit comprising:

supplying a DC voltage to the substrate supporting unit and supplying an RF power to the plasma generating unit, the DC voltage being a DC voltage for chucking the substrate and the RF power being a process RF power for treating the substrate;

supplying a first discharging DC voltage to the substrate supporting unit and supplying a first discharging RF power to the plasma generating unit during a first discharging time period;

supplying a second discharging DC voltage to the substrate supporting unit and supplying a second discharging RF power greater than the first discharging RF power to the plasma generating unit during a second discharging time period longer than the first discharging time period after the first discharging time period; and supplying the second discharging DC voltage to the substrate supporting unit and supplying a third discharging RF power greater than zero and less than the first discharging RF power to the plasma generating unit during a third discharging time period after the discharging time period.

* * * * *

UNITED STATES PATENT AND TRADEMARK OFFICE
CERTIFICATE OF CORRECTION

PATENT NO. : 11,881,382 B2
APPLICATION NO. : 16/918219
DATED : January 23, 2024
INVENTOR(S) : Jun Pyo Hong, Seungbae Lee and Ki Yung Lee Page 1 of 1

It is certified that error appears in the above-identified patent and that said Letters Patent is hereby corrected as shown below:

In the Claims

Column 8, Line 9, Claim 1: change "units" to --unit,--.

Column 8, Line 13, Claim 1: change "unit" to --unit,--.

Signed and Sealed this
Twenty-sixth Day of November, 2024

Katherine Kelly Vidal
*Director of the United States Patent and Trademark Office*